United States Patent
Nishida (10) Patent No.: US 7,589,509 B2
(45) Date of Patent: Sep. 15, 2009

(54) SWITCHING REGULATOR (75) Inventor: Junji Nishida, Neyagawa (JP)

(73) Assignee: Ricoh Company, Ltd., Tokyo (JP)

( * ) Notice: Subject to any disclaimer, the term of this patent is extended or adjusted under 35 U.S.C. 154(b) by 179 days.

(21) Appl. No.: 11/898,623

(22) Filed: Sep. 13, 2007

(65) Prior Publication Data

US 2008/0068054 A1 Mar. 20, 2008

(30) Foreign Application Priority Data

Sep. 14, 2006 (JP) .............................. 2006-248952

(51) Int. Cl.
G05F 1/00 (2006.01)
(52) U.S. Cl. ..................................... 323/283
(58) Field of Classification Search ................ 323/283, 323/282, 284; 327/14, 170
See application file for complete search history.

(56) References Cited

U.S. PATENT DOCUMENTS 6,744,241 B2 *  6/2004  Feldtkeller .................. 323/207
6,803,745 B2    10/2004  Nishida et al.
7,012,405 B2     3/2006  Nishida et al.
7,098,627 B2     8/2006  Nishida et al.

FOREIGN PATENT DOCUMENTS

| JP | 11-041924 | 2/1999 |
| JP | 2005-229744 | 8/2005 |

\* cited by examiner

*Primary Examiner*—Shawn Riley
(74) *Attorney, Agent, or Firm*—Dickstein Shapiro LLP

(57) ABSTRACT

A switching regulator that includes a switching transistor configured to control an output current by switching, a proportional current generator configured to generate a current proportional to a current flowing through the switching transistor, a first slope voltage generator configured to generate a linear slope voltage, a second slope voltage generator configured to generate a slope voltage having a secondary curve characteristic by integrating the current proportional to the current flowing through the switching transistor, and a slope voltage compensation circuit to generate a superimposed slope voltage formed by superimposing an output voltage of the first slope voltage generator on an output voltage of the second slope voltage generator.

10 Claims, 5 Drawing Sheets

(a) CURRENT OF SWITCHING DEVICE 21

(b) VOLTAGE OF CAPACITOR 25

(c) SLOPE VOLTAGE Vslope

SWITCHING REGULATOR

This patent application claims priority from Japanese Patent Application No. 2006-248952 filed on Sep. 14, 2006 in the Japan Patent Office, the entire contents of which are hereby incorporated by reference herein.

BACKGROUND OF THE INVENTION

1. Field

This patent specification describes a switching regulator, and more particularly, a switching regulator capable of performing stable operation over a wide range of operating conditions.

2. Background Art

Recently, a variety of different types of high performance-electrical equipment, such as computer systems and mobile phones, have developed rapidly and come to be used widely. Such electrical equipment requires a power circuit having a high performance, and such a power circuit generally includes a switching regulator to achieve a stable operation.

There are two types of switching regulators: voltage-mode and current-mode switching regulators. A conventional switching regulator generally employs a voltage mode control method. Using the voltage mode control method, the switching regulator uses PWM (Pulse Width Modulation) to stabilize an output voltage by switching the switching device in accordance with a voltage difference between the output voltage and a predetermined reference voltage. However, because a feedback signal is obtained by detecting an output voltage, the switching regulator has several problems, such as slow response speed to input voltage change and a need to use a complex phase compensation circuit.

On the other hand, the current-mode switching regulator has several advantages, such as good liner-regulation and simple phase compensation. Consequently, the current mode switching regulator has come to be widely used recently. However, when an on-duty of the PWM control exceeds 50%, the current-mode switching regulator cannot be controlled due to occurrence of sub-harmonic oscillation, in which the switching regulator oscillates at an integral multiple frequency of a switching frequency. Accordingly, the switching regulator using PWM control generally employs slope compensation to avoid the occurrence of sub-harmonic oscillation.

To perform the slope compensation, a liner slope voltage is generally added to a converted slope voltage converted from a current value of an inductor to a voltage value. Further, a slope voltage having a high-order voltage wave with respect to time may be added to obtain a stable operation of an error amplifier.

Figure 1:
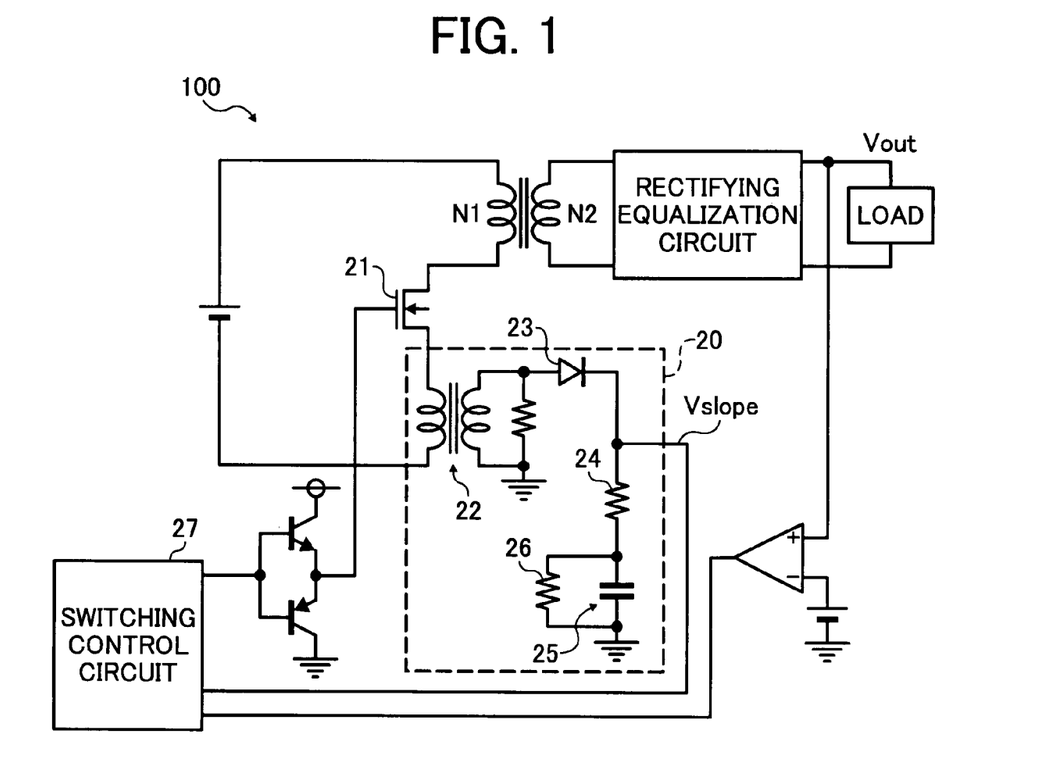
FIG. 1 illustrates a conventional switching regulator.

FIG. 1 is a circuit diagram of a conventional switching regulator 100. The switching regulator 100 includes a slope voltage compensation circuit 20 and a switching device 21. The slope voltage compensation circuit 20 includes a current transformer 22, a diode 23, resistors 24 and 26, and a capacitor 25. The switching device 21 is formed of an NMOS transistor.

In the conventional switching regulator 100 of FIG. 1, a current flowing through the switching device 21 is detected by the current transformer 22. A current proportional to the current flowing through the switching device 21 is drawn from a secondary side of the current transformer 22 to charge the capacitor 25 through the diode 23 and the resistor 24.

Figure 2:
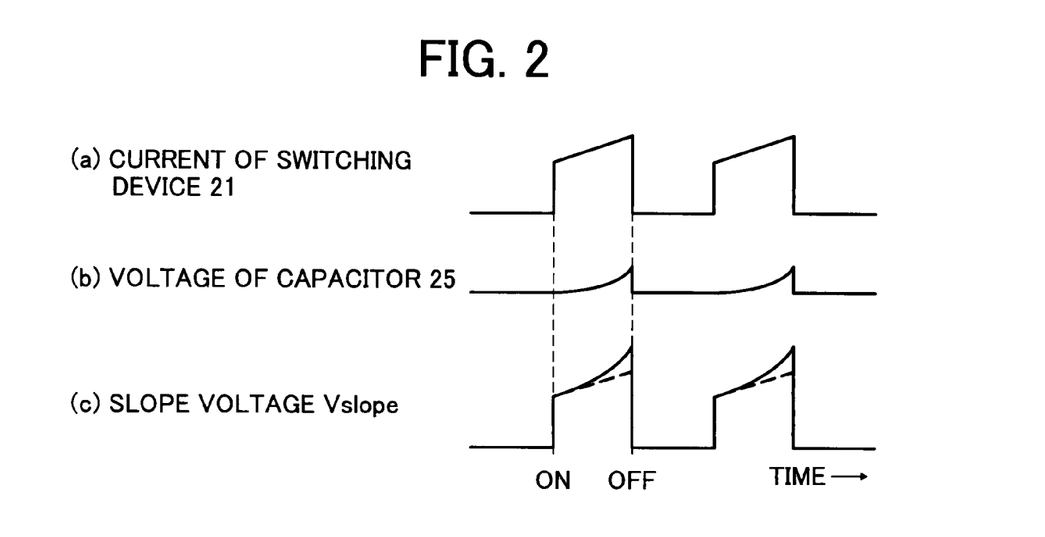
FIG. 2 illustrates waveforms of the slope voltage compensation circuit of the switching regulator of FIG. 1.

FIG. 2 illustrates waveforms of the slope voltage compensation circuit 20 of the switching regulator 100 of FIG. 1.

When the switching device 21 is turned on based on a drive signal from a switching control circuit 27, the switching device 21 has a current increasing linearly on time as shown by a waveform (a) in FIG. 2. A proportional current proportional to the current of the switching device 21 is induced at a secondary side of the current transformer 22. Then, the induced current charges the capacitor 25 through the diode 23 and the resistor 24. A charging voltage of the capacitor 25 increases over time with a secondary curved slope as shown by a waveform (b) in FIG. 2. Therefore, the slope voltage Vslope is an output signal of the slope voltage compensation circuit 20 and is output from a connection node of a cathode of the diode 23 and the resistor 24, with a summation of voltage drop value at the resistor 24 and a charge-up voltage value of the capacitor 25.

As the slope voltage Vslope has a secondary curved slope as shown by a waveform (c) in FIG. 2, the switching regulator 100 has enough of a margin against the occurrence of sub-harmonic oscillation to achieve stable operation. However, in this configuration, it is difficult to obtain a slope voltage with a flexible slope angle over time with a combination of a slope angle of a linear part and a slope angle of a secondary curved part, because the slope voltage is based directly on the current of the switching device 21. In other words, it may not be possible to obtain a desired slope voltage. Further, the switching regulator 100 shown in FIG. 1 cannot be made compact and cannot be integrated onto an IC (integrated circuit) because the current transformer is necessary in this circuitry.

As described with reference of FIG. 1, the switching regulator 100 shown in FIG. 1 employs an integration circuit to integrate the current of the switching element 21. However, there are other switching regulators that utilize a saturation characteristic of a transistor to generate a non-linear slope voltage. Such a switching regulator that generates the non-linear slope voltage using the saturation characteristic of the transistor includes a constant current source, a MOS transistor and a capacitor connected to the MOS transistor. The non-linear slope voltage is generated by controlling a gate of the MOS transistor. However, a drawback of such switching regulator is that it requires a MOS transistor with a large size and a dedicated integrating circuit to generate the non-linear slope voltage.

SUMMARY

This patent specification describes a novel switching regulator that includes a switching transistor configured to control an output current by switching, a proportional current generator configured to generate a current proportional to a current flowing through the switching transistor, a first slope voltage generator configured to generate a linear slope voltage, a second slope voltage generator configured to generate a slope voltage having a secondary curve characteristic by integrating the current proportional to the current flowing through the switching transistor, and a slope voltage compensation circuit to generate a superimposed slope voltage formed by superimposing an output voltage of the first slope voltage generator on an output voltage of the second slope voltage generator.

This patent specification further describes a novel switching regulator having a slope compensator that includes a switching transistor and a proportional current generator. The switching transistor comprises a first MOS transistor, and the proportional current generator comprises a second MOS transistor to form a current mirror circuit with the first MOS transistor and to have equal conductivity to the first MOS transistor. The second MOS transistor comprises a plurality of unit MOS transistors serially connected, the unit MOS transistor has equal gate length to a gate length of the first MOS transistor, the second MOS transistor is divided into unit transistor groups having a predetermined number of the unit MOS transistors, and backgates of each unit MOS transistor are commonly connected in the unit transistor group and the commonly connected backgate node is connected to a source of the unit transistor.

Further, this patent specification describes a novel switching regulator that includes a first and second MOS transistors to form a current mirror circuit. The second MOS transistor is divided into unit transistor groups each having a predetermined number of the unit MOS transistors, and backgates of each unit MOS transistor are commonly connected in the unit transistor group and a commonly connected backgate node is connected to a source of the unit transistor.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DETAILED DESCRIPTION

In describing certain preferred embodiments illustrated in the drawings, it is to be noted that specific terminology is employed solely for the sake of clarity. Accordingly, the disclosure of the present patent specification is not intended to be limited to the specific terminology so selected, and it is therefore to be understood that each specific element includes all technical equivalents that operate in a similar manner.

Referring now to the drawings, wherein like reference numerals designate identical or corresponding parts throughout the several views, switching regulators according to certain example embodiments are described.

Figure 3:
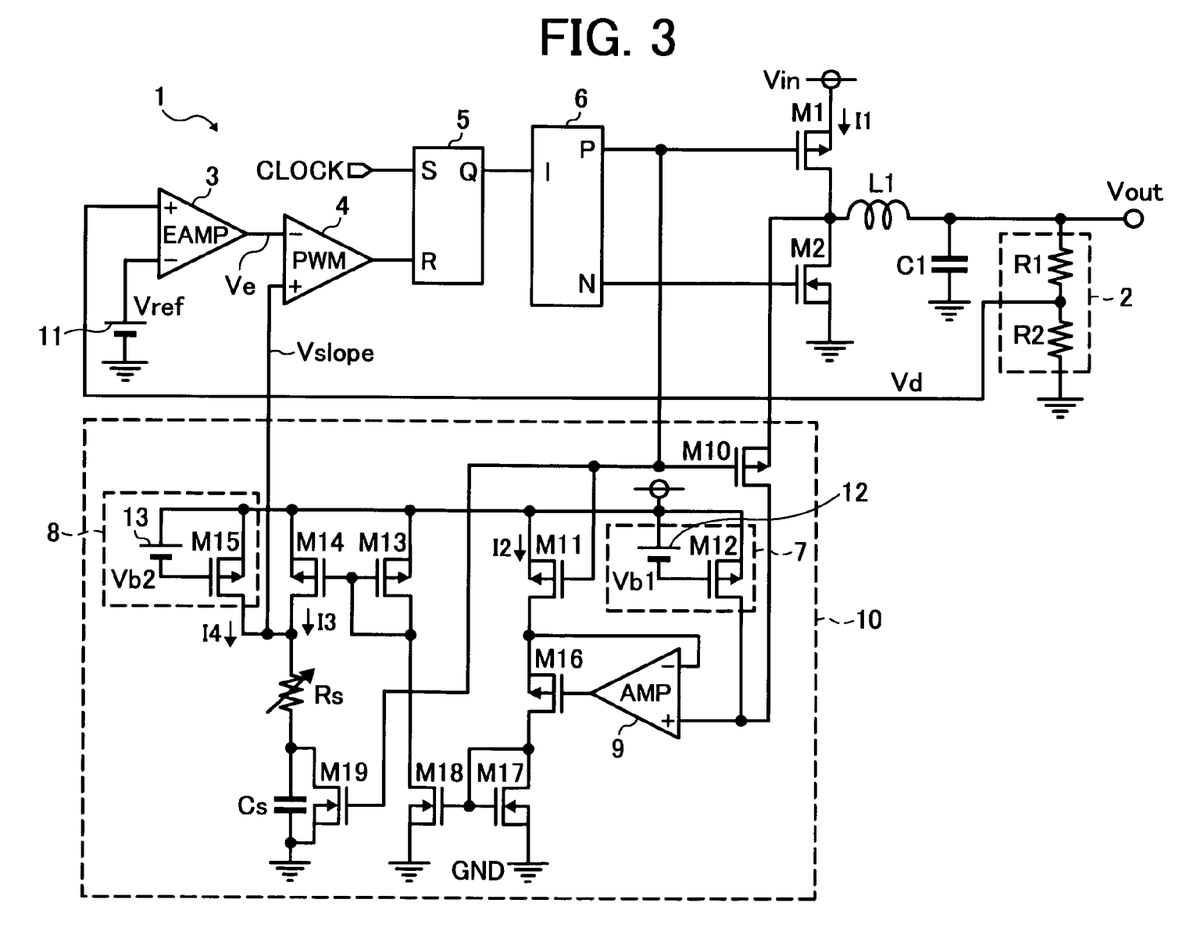
FIG. 3 illustrates a switching regulator according to a first exemplary embodiment of the invention.

FIG. 3 illustrates a switching regulator 1 according to a first example embodiment. The switching regulator 1 employs a peak-current-control type PWM control. As shown in FIG. 3, the switching regulator 1 includes an output voltage detector 2, an error amplifier 3, a PWM comparator 4, a latch circuit 5, a driver circuit 6, a switching device M1, a synchronization rectification device M2, an inductor L1, an output capacitor C1, and a slope compensation circuit 10.

The output voltage detector 2 includes two bleeder resistors R1 and R2, and detects an output voltage Vout using the bleeder resistors R1 and R2. The error amplifier 3 compares a detected voltage Vd with a reference voltage Vref of a reference voltage source 11. The PWM comparator 4 receives an error signal Ve from the error amplifier 3 and a slope signal Vslope from the slope compensation circuit 10. The latch circuit 5 receives an output signal from the PWM comparator 4 at an input terminal R. The driver circuit 6 receives an output signal from the latch circuit 5 at an input terminal I. The switching device M1 and the synchronization rectification device M2 are driven by the driver circuit 6.

The inductor L1 and the output capacitor C1 form a smoothing circuit. The switching device M1 is formed of a PMOS transistor and the synchronization rectification device M2 is formed of an NMOS transistor.

The slope compensation circuit 10 receives two signals. One is a signal from a terminal P of the driver circuit 6 that drives the switching device M1, and another is a signal from a connection node of the switching device M1 and the inductor L1. The slope compensation circuit 10 outputs the slope signal Vslope to one input terminal of the PWM comparator 4.

The slope compensation circuit 10 includes a plurality of MOS transistors M10 through M19, a capacitor Cs, a variable resistor Rs, a first bias power source 12, a second bias power source 13, a second current source 8, and an operational amplifier 9. The first bias power source 12 generates a first bias voltage Vb1, and the second bias power source 13 generates a second bias voltage Vb2. The MOS transistors M10 through M16 are formed of PMOS transistors and the MOS transistors M17 through M19 are formed of NMOS transistors.

As shown in FIG. 3, a source of the PMOS transistor M10 is connected to the connection node of the switching device M1 and the inductor L1. A drain of the PMOS transistor M10 is connected to a non-inverted input terminal of the operational amplifier 9. A gate of the PMOS transistor M10 is connected to the terminal P of the driver circuit 6 and receives an equal signal to the switching device M1.

The non-inverted input terminal of the operational amplifier 9 is pulled up to an input voltage Vin through the PMOS transistor M12. The PMOS transistor M12 and the first bias power source 12 form a first constant current source because a gate of the PMOS transistor M12 is connected to the first bias power source 12.

An inverted input terminal of the operational amplifier 9 is connected to a connection node of a drain of the PMOS transistor M11 and a source of the PMOS transistor M16. An output terminal of the operational amplifier 9 is connected to a gate of the PMOS transistor M16. A source of the PMOS transistor M11 is connected to the input voltage Vin and a gate of the PMOS transistor M11 is commonly connected with the gate of the switching device M1. Accordingly, the PMOS transistor M11 and the switching device M1 form a first current mirror circuit.

A drain of the PMOS transistor M16 is connected to a drain of the NMOS transistor M17. A source of the NMOS transistor M17 is grounded. A gate of the NMOS transistor M17 is wired to the drain of the NMOS transistor M17. A source of the NMOS transistor M18 is grounded. A gate of the NMOS transistor M18 is wired to the gate of the NMOS transistor M17. Accordingly, the NMOS transistors M17 and M18 form a second current mirror circuit.

A drain of the NMOS transistor M18 is connected to a drain of the PMOS transistor M13. A source of the PMOS transistor M13 is connected to the input voltage Vin. A gate of the PMOS transistor M13 is connected to the drain of the PMOS transistor M13 and to a gate of the PMOS transistor M14. A source of the NMOS transistor M18 is grounded. As a source of the PMOS transistor M14 is connected to the input voltage Vin, the PMOS transistors M13 and M14 form a third current mirror circuit.

A drain of the PMOS transistor M14 is connected to one end of the variable resistor Rs. Another end of the variable resistor Rs is connected to one end of the capacitor Cs and another end of the capacitor Cs is grounded.

A source of the PMOS transistor M15 is connected to the input voltage Vin and a drain of the PMOS transistor M15 is commonly connected to a drain of the PMOS transistor M14. As the second bias voltage Vb2 is applied to a gate of the PMOS transistor M15, the PMOS transistor M15 and the second bias power source 13 form a second constant current source.

A drain of the NMOS transistor M19 is connected to one end of the capacitor Cs. A source of the NMOS transistor M19 is grounded. A gate of the NMOS transistor M19 is connected to the terminal P of the driver circuit 6 and receives equal signal to the switching device M1.

Figure 4:
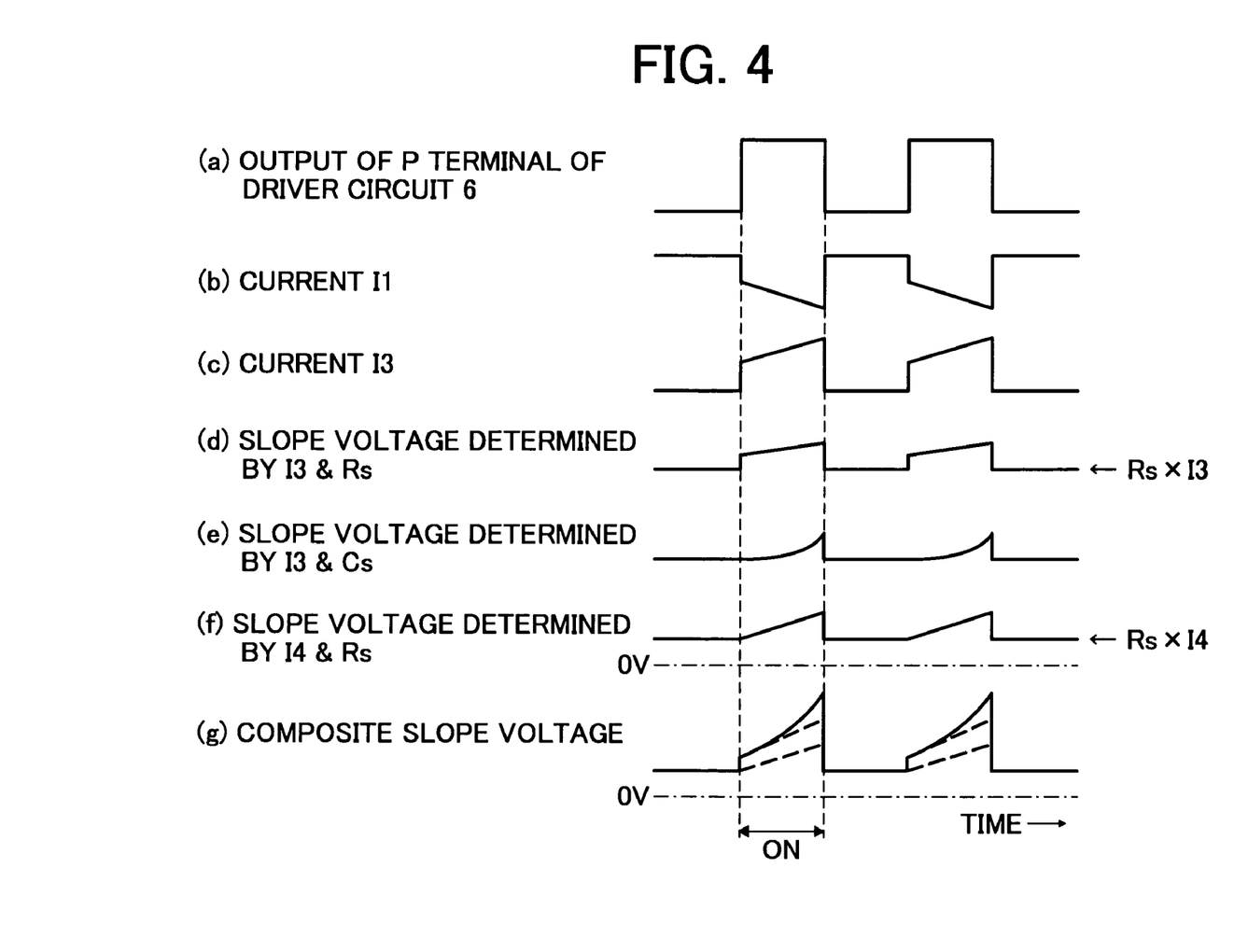
FIG. 4 illustrates waveforms output from a slope compensation circuit shown in FIG. 3.

Next, operation of the slope compensation circuit 10 used in the switching regulator 1 is described. FIG. 4 illustrates waveforms output from the slope compensation circuit 10 and related to the slope voltage Vslope.

A drain current I2 of the PMOS transistor M11 is converted to a drain current I3 of the PMOS transistor M14 through the second current mirror circuit and the third current mirror circuit. As described in the foregoing description, the PMOS transistor M11 forms the first current mirror circuit with the switching device M1. The second current mirror circuit is formed of the NMOS transistors M17 and M18. The third current mirror circuit is formed of the PMOS transistors M13 and M14. The drain current I3 of the PMOS transistor M11 charges the capacitor Cs through the resistor Rs.

When the output signal with high level output from the terminal P of the driver circuit 6 and the switching device M1 is off, the drain current I2 does not flow at the switching device M11 of the first current mirror circuit because there is no drain current I1 at the switching device M1. The drain current I3 does not flow at the PMOS transistor M14 of the third current mirror circuit provided through the second current mirror circuit. Accordingly, the capacitor Cs is not charged.

As the NMOS transistor 19 is turned on while switching device M1 is turned off, a charge stored in the capacitor Cs is discharged. Consequently, a voltage value between terminals of the capacitor Cs decreases to 0 v. However, under this condition, the current I4 is supplied from the second current source 8. The second current source 8 is formed of the PMOS transistor M15 and the second bias source 13. Accordingly, a voltage drop is being generated at the resistor Rs and is expressed by a formula rs×I4, where rs is resistance of the resistor Rs. Then, the slope voltage Vslope is expressed as (rs×I4)v.

Meanwhile, as the PMOS transistor 10 is turned off while switching device M1 is turned off, a non-inverted input terminal of the operational amplifier 9 is released from the connection node of the switching device M1 and the inductor L1. The non-inverted input terminal of the operational amplifier 9 is pulled up to the input voltage Vin by the PMOS transistor M12. Accordingly, the operational amplifier 9 controls a gate voltage of the PMOS transistor M16 to make a drain voltage of the PMOS transistor M11 to be around the input voltage Vin.

When the switching device M1 is turned on by a low level output from the terminal P of the driver circuit 6, the PMOS transistor M10 is turned on. Then, a voltage at a connection node of the switching device M1 and the inductor L1 is input to the non-inverted terminal of the operational amplifier 9. Accordingly, it is possible to reduce an error between the switching device M1 and the inductor L1 due to λ-effect because the operational amplifier 9 controls a gate voltage such that a drain voltage of the PMOS transistor M11 is equal to a drain voltage of the switching device M1.

The drain current I1 of the switching device M1 is converted to the drain current I3 of the PMOS transistor M14 through the three current mirror circuits. The drain current I3 is proportional to the drain current I1 of the switching device M1.

In FIG. 4, the output signal of the terminal P of the driver circuit 6 is shown by a waveform (a), the drain current I1 is shown by a waveform (b), and the drain current I3 of the PMOS transistor M14 that is a proportional current to the drain current I1 is shown by a waveform (c). As shown in the waveform (c) in FIG. 4, the drain current I3 increases proportional to time and charges the capacitor Cs through the resistor Rs. As the NMOS transistor M19 is off, a voltage waveform of the capacitor Cs being charged by the current I3 increases over time with a secondary curve as shown in a waveform (e) in FIG. 4.

A voltage drop at the resistor Rs caused by the current I3 is expressed by rs×I3, where rs is resistance of the resistor Rs. A waveform of the voltage drop is shown in a waveform (d) in FIG. 4 and has a linear curve increasing over time. Further, the drain current I4 charges the capacitor Cs through the resistor Rs. A voltage waveform of the capacitor Cs being charged by the current I4 is shown in a waveform (f) in FIG. 4 and has a linear curve increasing over time. Since a summation of the drain currents I3 and I4 actually charges the capacitor Cs, a voltage waveform of the superimposed slope voltage Vslope is shown in a waveform (g) in FIG. 4 and has a secondary curve characteristic increasing over time.

As described above, the switching regulator is configured to output the slope voltage Vslope by superimposing the linear slope voltage generated by the drain current I4 having a constant current on the secondary curved slope voltage generated by the current I3 proportional to the current I1 of the switching device M1. According to the first example embodiment of the switching regulator, the switching regulator can change a slope angle of the linear slope voltage flexibly to fit a characteristic of the circuit. Further, the secondary curved slope voltage is added in addition to the linear slope voltage. Accordingly, the waveform can be optimized to have a desired slope such that the switching regulator has a stable operational characteristic.

Further, in the switching regulator according to the first example embodiment, an amount of the voltage drop can be adjusted by the variable resistor Rs. Accordingly, the switching regulator can perform a pulse skip operation even at a light load condition.

A second example embodiment of the switching regulator is now described in detail. In the second example embodiment, circuitry is identical to the circuitry of the switching regulator according to the first example embodiment described above except for the configuration of the PMOS transistor M11.

Figure 5A:
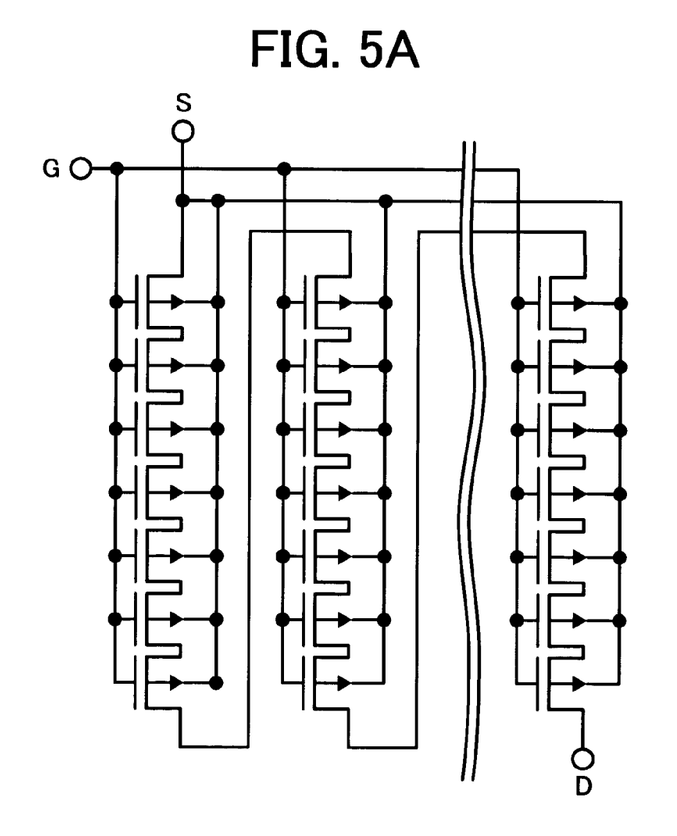
FIGS. 5A and 5B illustrate configurations of a composite transistor that forms a first current mirror circuit with a switching device.
Figure 5B:
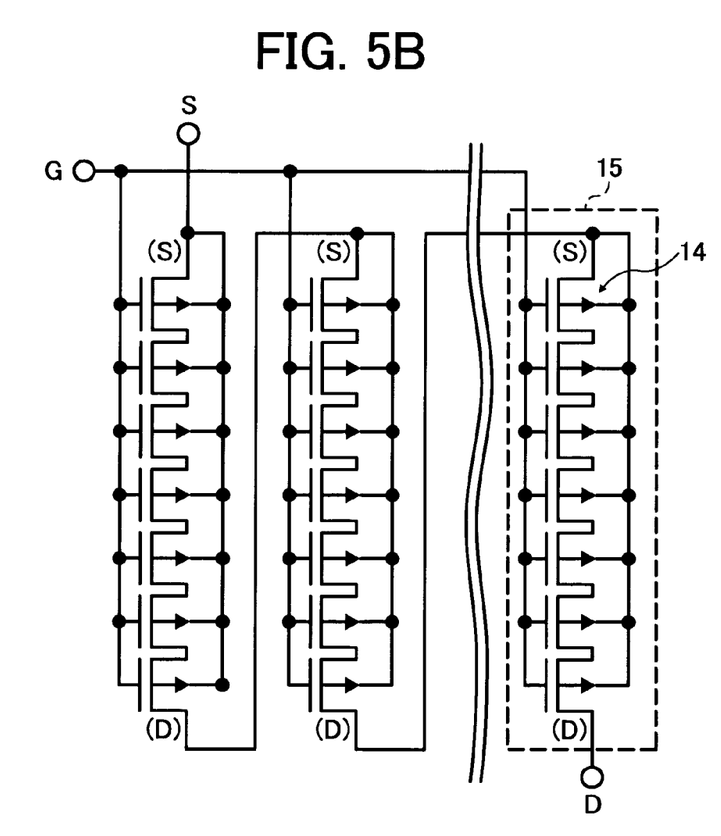

FIGS. 5A and 5B illustrate configurations of a composite transistor used as the PMOS transistor M11. The composite transistor forms the first current mirror circuit with the switching device M1. FIG. 5A illustrates a circuit configuration of a conventional circuit as a reference. FIG. 5B illustrates a circuit configuration according to the example embodiment of the present disclosure.

A drain current I2 of the PMOS transistor M11 is far smaller in comparison to the current I1 of the switching device M1. Generally, a current mirror circuit can make a proportional current by changing a size ratio of a pair of transistors. For example, to obtain one of Nth current value of drain current of the switching device M1 as an output current of the PMOS transistor M11, a configuration is determined according to formula (1), $$(W1/L1)/(W2/L2)=N \quad (1)$$

where L1 and W1 are a channel length and a channel width of the switching device M1, respectively, and L2 and W2 are a channel length and a channel width of the PMOS transistor M11, respectively.

However, basic characteristics of the transistor, for example, gate voltage dependence and temperature of the drain current, change depending on the channel length. Accordingly, a proportional relation cannot be maintained and the basic characteristics of the transistor may vary over a wide range of operating conditions. Therefore, a fixed channel length is generally used, and the channel width is adjusted to obtain a desired proportional output current.

When N number is large, such as a few thousand or several tens of thousands, it is not possible to obtain a desired characteristic only by changing the channel width. Therefore, the conventional current mirror circuit employs a plurality of unit MOS transistors connected in series to form a composite transistor as the PMOS transistor M11 as shown in FIG. 5A.

One end of the unit MOS transistors serially connected is used as a source, another end is used as a drain, and gates of all the unit MOS transistors are connected commonly, with the commonly connected gate node used as a gate of the composite transistor. Each unit MOS transistor has a channel length equal to a channel length of the switching transistor M1 and has identical transistor characteristic. Backgates of each unit MOS transistor are commonly connected. The commonly connected backgate node is connected to a source of the composite transistor.

In this configuration of the composite transistor, an equivalent gate length and gate width are expressed by L×M, and W, respectively, where L is gate length, W is gate width of each unit MOS transistor, and M is a number of the unit MOS transistors. For example, when the switching device M1 includes 580 unit MOS transistors connected in parallel each of which has a gate width of 50 um and a gate length of 0.5 um, a composite gate width is 29000 um and W/L is 29,000/0.5=58,000.

When a current ratio of the switching device M1 and the PMOS transistor M11 is 1,000,000:1 using each unit MOS transistor having a gate width of 2 um and a gate length of 0.5 um, and the PMOS transistor M11 includes 70 unit MOS transistors connected in series, the composite gate length L of the PMOS transistor M11 is 35 um, and W/L of the PMOS transistor M11 is 58,000:0.057 and is approximately 1,000,000:1.

However, referring to each unit MOS transistor when the PMOS transistor M11 is configured as shown in FIG. 5A, voltage differences between the backgate and the source of the unit MOS transistor are different among the unit MOS transistors because the backgate of each unit MOS transistor is connected to the source of the composite transistor. Characteristics of the unit MOS transistor provided at a closest position to the source of the composite transistor are different from characteristics of the unit MOS transistor provided at a closest position to the drain of the composite transistor due to differences of backgate bias voltages. As a result, the above-described proportional relation cannot be obtained with this configuration.

The switching regulator according to the second embodiment employs a composite transistor configuration as shown in FIG. 5B to form the PMOS transistor M11. In this composite transistor, seven unit MOS transistors 14 are connected in series to form a unit transistor 15. In each unit transistor 15, backgates of each unit MOS transistor are commonly connected. The commonly connected backgate node is connected to a source of the unit transistor. Using the configuration shown in FIG. 5B reduces voltage differences between the backgate and the source of the unit MOS transistor 14 compared to the voltage differences in the configuration shown in FIG. 5A. Consequently, the proportional relation of the current mirror becomes a value close to the desired calculation value.

Figure 6:
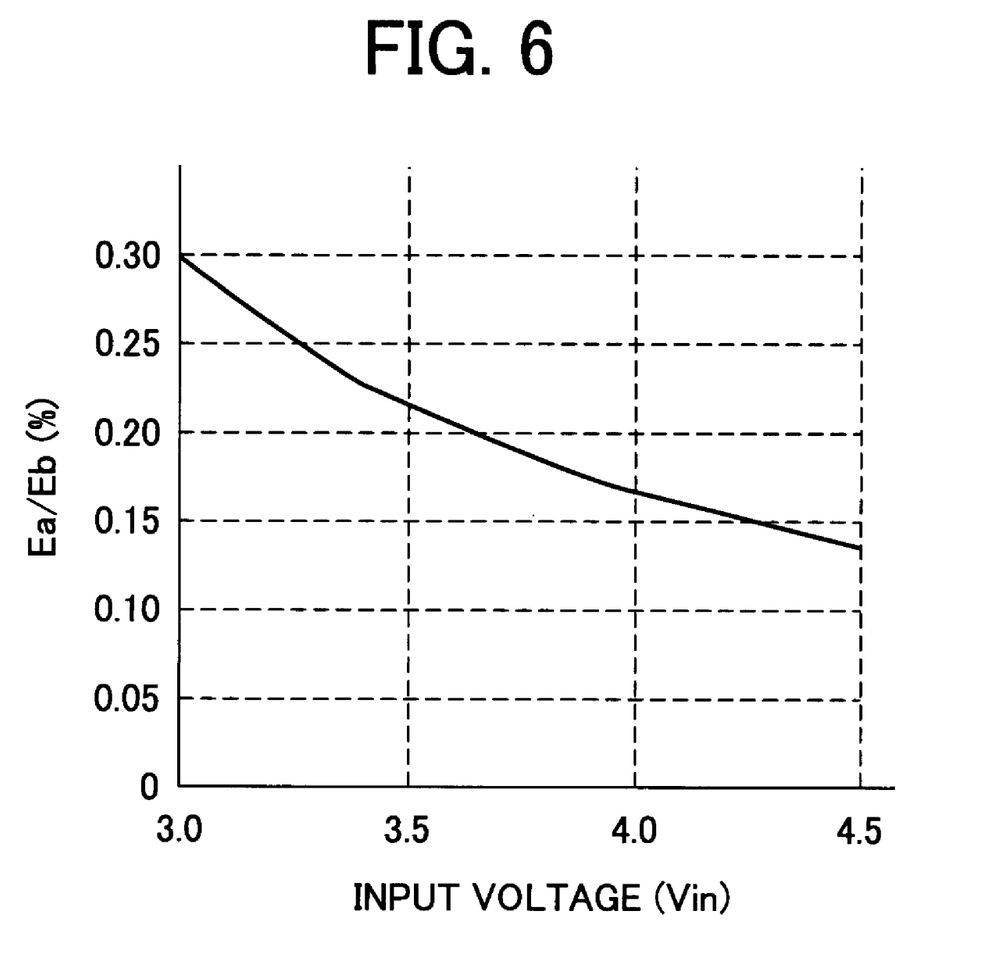
FIG. 6 is a graph showing a relation between error ratio Ea/Eb and input voltage Vin.

FIG. 6 is a graph showing a relation between error ratio Ea/Eb and the input voltage Vin. Error Ea is a difference between an output voltage characteristic using the conventional composite transistor shown in FIG. 5A and an ideal characteristic, and error Eb is a difference between an output voltage characteristic using the composite transistor according to the second embodiment as shown in FIG. 5B and the ideal characteristic. The error ratio Ea/Eb is shown on a vertical axis and the input voltage Vin is shown on a horizontal axis.

Referring to the graph, as the input voltage Vin is lower, the error Ea is larger in comparison to the error Eb. Consequently, it is understand that the transistor configuration according to the second example embodiment contributes to improve the characteristic of the switching regulator.

In the second example embodiment, one unit transistor 15 includes seven unit MOS transistors 14. Alternatively, however, another number of unit MOS transistors 14 can be employed to form a unit transistor 15. If fewer than seven unit MOS transistors 14 are used, it may be possible to reduce a backgate voltage effect and the improvement may be larger. However, as the number of unit MOS transistors 14 increases, a wider area is necessary to form the composite transistor in a chip because the number of separation zones to separate the unit MOS transistors increases. Accordingly, the optimum number of unit MOS transistors must be determined by considering a balance between a desired improvement level and a necessary chip size.

As described in the example embodiments, the slope voltage Vslope is output by superimposing a linear slope voltage generated by a drain current having a constant current value on a secondary curved slope voltage generated by a current proportional to a current of a switching device such that a linear portion of the slope voltage can be optimized to have a desired slope. Further, since a secondary curved slope voltage is added, the switching regulator has a stable operational characteristic.

Further, as the switching regulator can adjust an amount of a voltage drop using a variable resistor, the switching regulator according to the example embodiments can perform a pulse skip operation even at a light load condition.

According to the example embodiment, it is possible to obtain the switching regulator having high performance by determining a current mirror circuit to have an ideal characteristic close to a calculated value.

Numerous additional modifications and variations are possible in light of the above teachings. It is therefore to be understood, that within the scope of the appended claims, the disclosure of this patent specification may be practiced otherwise than as specifically described herein.

What is claimed is:

1. A slope voltage compensator, comprising:
   a switching transistor configured to control an output current by switching;

a proportional current generator configured to generate a current proportional to a current flowing through the switching transistor;

a first slope voltage generator configured to generate a linear slope voltage;

a second slope voltage generator configured to generate a slope voltage having a secondary curve characteristic by integrating the current proportional to the current flowing through the switching transistor; and a slope voltage compensation circuit to generate a superimposed slope voltage formed by superimposing an output voltage of the first slope voltage generator on an output voltage of the second slope voltage generator.

2. The slope voltage compensator of claim 1, wherein the first slope voltage generator comprises:

a current source; and a capacitor to be charged by an output current of the current source and to output a linear slope voltage.

3. The slope voltage compensator of claim 2, wherein the first slope voltage generator further comprises a resistor provided between the current source and the capacitor and a summational voltage of a voltage drop at the resistor and the voltage of the capacitor is a linear slope voltage.

4. The slope voltage compensator of claim 1, wherein the second slope voltage generator comprises a capacitor to be charged by a proportional current of the proportional current generator and to output the slope voltage having the secondary curve characteristic.

5. The slope voltage compensator of claim 4, wherein the second slope voltage generator further comprises a resistor provided between the proportional current generator and the capacitor, and a summational voltage of a voltage drop at the resistor and the voltage of the capacitor is a secondary curved slope voltage.

6. The slope voltage compensator of claim 1, wherein the first slope voltage generator comprises:

a current source;

a capacitor to be charged by an output current of the current source and to output a linear slope voltage; and a resistor provided between the current source and the capacitor, wherein the second slope voltage generator comprises:

a capacitor to be charged by a proportional current of the proportional current generator and to output the slope voltage having the secondary curve characteristic; and a resistor provided between the proportional current generator and the capacitor, and wherein one capacitor is provided commonly to be charged by the output current of the current source and by the proportional current of the proportional current generator.

7. The slope voltage compensator of claim 6, wherein resistances of the resistors provided in the first and second slope voltage generators are variable.

8. The slope voltage compensator of claim 1, wherein the switching transistor comprises a first MOS transistor, and the proportional current generator comprises a second MOS transistor that forms a current mirror circuit with the first MOS transistor and has an equal conductivity to the first MOS transistor.

9. The slope voltage compensator of claim 8, wherein:

the second MOS transistor comprises a plurality of unit MOS transistors serially connected;

each unit MOS transistor has a gate length equal to a gate length of the first MOS transistor;

one end of the unit MOS transistors serially connected is used as a source of the second MOS transistor, another end is used as a drain of the second MOS transistor, and a connection node of all gates of the unit MOS transistors is used as a gate of second MOS transistor;

the second MOS transistor is divided into unit transistor groups each having a predetermined number of the unit MOS transistors; and backgates of each unit MOS transistor are commonly connected in the unit transistor group and a backgate node commonly connected is connected to a source of the unit transistor.

10. A switching regulator employing a slope voltage compensator, the slope voltage compensator comprising:

a switching transistor configured to control an output current by switching;

a proportional current generator configured to generate a current proportional to a current flowing through the switching transistor;

a first slope voltage generator configured to generate a linear slope voltage;

a second slope voltage generator configured to generate a slope voltage having a secondary curve characteristic by integrating the current proportional to the current flowing through the switching transistor; and a slope voltage compensation circuit to generate a superimposed slope voltage formed by superimposing an output voltage of the first slope voltage generator on an output voltage of the second slope voltage generator.

* * * * *